(12) United States Patent
Namer et al.

(10) Patent No.: US 11,281,829 B2
(45) Date of Patent: Mar. 22, 2022

(54) DEVICE, SYSTEM, AND METHOD FOR ADAPTIVE SIMULATION

(71) Applicant: Wind River Systems, Inc., Alameda, CA (US)

(72) Inventors: Assaf Namer, Alameda, CA (US); Anton Langebner, Alameda, CA (US)

(73) Assignee: Wind River Systems, Inc., Alameda, CA (US)

( * ) Notice: Subject to any disclaimer, the term of this patent is extended or adjusted under 35 U.S.C. 154(b) by 1171 days.

(21) Appl. No.: 14/869,495

(22) Filed: Sep. 29, 2015

(65) Prior Publication Data
US 2017/0091351 A1 Mar. 30, 2017

(51) Int. Cl.
*G06F 30/33* (2020.01)
(52) U.S. Cl.
CPC .................................... *G06F 30/33* (2020.01)
(58) Field of Classification Search
CPC .................................................. G06F 17/5009
USPC ............................................................ 703/22
See application file for complete search history.

(56) References Cited

U.S. PATENT DOCUMENTS

| 6,389,379 B1* | 5/2002 | Lin ...................... G06F 17/5022 703/14 |
| 2010/0232299 A1* | 9/2010 | Conway .............. H04L 41/0681 370/242 |

OTHER PUBLICATIONS

Simache et al. "Event Log based Dependability Analysis of Windows NT and 2K Systems" IEEE Proceedings of the 2002 Pacific Rim International Symposium on Dependable Computing (PRDC'02) 2002. (Year: 2002).*
Biyani, S., & Santhanam, P. (Nov. 1998). Exploring defect data from development and customer usage on software modules over multiple releases. In issre (p. 316). IEEE.*
White, Brian, et al. "An integrated experimental environment for distributed systems and networks." ACM SIGOPS Operating Systems Review 36.SI (2002): 255-270.*

* cited by examiner

*Primary Examiner* — Saif A Alhija
(74) *Attorney, Agent, or Firm* — Fay Kaplun & Marcin, LLP

(57) ABSTRACT

A device, system, and method performs an adaptive simulation. The method performed by a similar includes receiving a release to be incorporated into a user device, the user device being a deployed device. The method includes receiving a profile of the user device, the profile being indicative of settings and usage information of the user device. The method includes generating a simulated user device corresponding to the user device, the simulated user device having a simulated profile corresponding to the profile. The method includes performing, by the simulator, a simulation for the release based upon the simulated user device and the simulated profile.

20 Claims, 4 Drawing Sheets

DEVICE, SYSTEM, AND METHOD FOR ADAPTIVE SIMULATION

BACKGROUND INFORMATION

A network of physical objects having electronics, programming, sensors, etc. may collectively be referred to as the Internet of Things (IoT). These physical objects of the IoT may include a connectivity functionality to provide further value and service by exchanging data with other connected devices. The IoT allows devices to be identified and controlled remotely across networks to create opportunities for various purposes such as integration. This may result in improved efficiency, accuracy, economic benefit, etc. Although each device is uniquely identifiable through embedded indicators (e.g., computing or operating system), the devices in the IoT are capable of interoperating within the existing Internet infrastructure.

During the course of using the devices that are deployed, there may be updates, additions, deletions, etc. to hardware and/or software. Prior to distributing the hardware/software release, a provider of the release may perform simulations to determine the effectiveness of the release including any issues that may be experienced when applying the release on the deployed devices. That is, the provider may utilize an edge management system to perform this functionality. Conventionally, the provider may utilize a profile of the device such as the hardware and software settings at the time the device is deployed. The provider may also make assumptions such as prior updates, additions, deletions, etc. that are known to have occurred on the provider end (but not necessarily at the device end). Accordingly, the simulations for deployed devices may be performed using the known settings at deployment and assumed settings since deployment. Otherwise, a complete, thorough, and exhaustive analysis using simulations requires substantial resources as every permutation may be checked. However, such an analysis approach is time consuming and unproductive.

Subsequent, new devices may also be deployed. Prior to deployment, the manner in which the new devices perform may be tested as well through simulations. The simulations performed on these new devices may utilize any current settings being used. However, the simulations being performed for deployed or new devices do not consider an actual profile of the device.

SUMMARY OF THE INVENTION

The present invention relates to a method comprising: receiving, by a simulator, a release to be incorporated into a user device, the user device being a deployed device; receiving, by the simulator, a profile of the user device, the profile being indicative of settings and usage information of the user device; generating, by the simulator, a simulated user device corresponding to the user device, the simulated user device having a simulated profile corresponding to the profile; and performing, by the simulator, a simulation for the release based upon the simulated user device and the simulated profile.

The present invention relates to a simulator comprising: a transceiver configured to exchange data with a user device; and a processor receiving a release to be incorporated into a user device, the user device being a deployed device, the processor receiving a profile of the user device, the profile being indicative of settings and usage information of the user device, the processor generating a simulated user device corresponding to the user device, the simulated user device having a simulated profile corresponding to the profile, the processor performing a simulation for the release based upon the simulated user device and the simulated profile.

The present invention relates to a non-transitory computer readable storage medium with an executable program stored thereon, wherein the program instructs a microprocessor to perform operations comprising: receiving a release to be incorporated into a user device, the user device being a deployed device; receiving a profile of the user device, the profile being indicative of settings and usage information of the user device; generating a simulated user device corresponding to the user device, the simulated user device having a simulated profile corresponding to the profile; and performing a simulation for the release based upon the simulated user device and the simulated profile.

DETAILED DESCRIPTION

Figure 1:
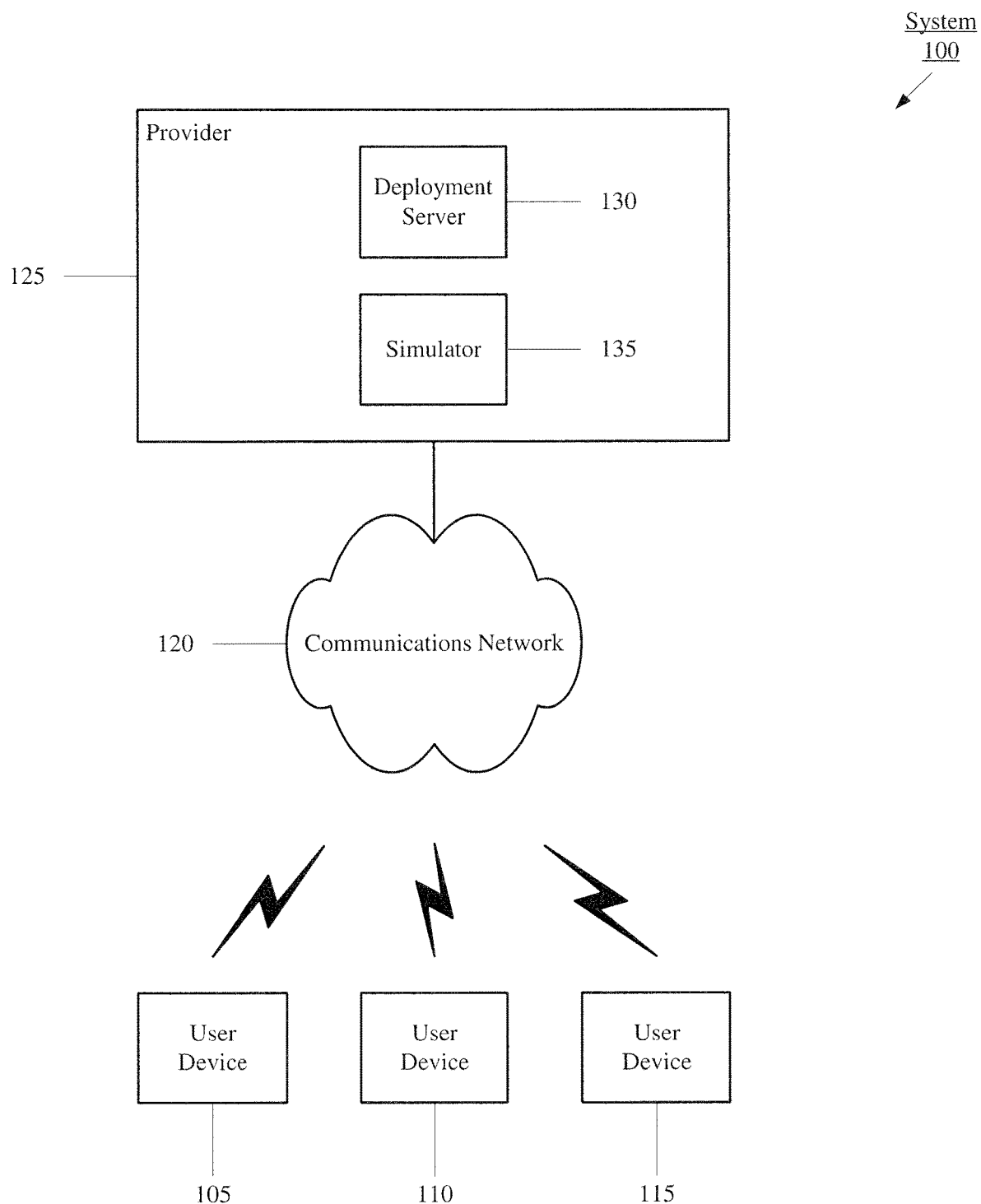
FIG. 1 shows a system according to the exemplary embodiments.

The exemplary embodiments may be further understood with reference to the following description and the related appended drawings, wherein like elements are provided with the same reference numerals. The exemplary embodiments are related to a device, a system, and a method for performing a simulation using an accurate profile of a user device. Specifically, the exemplary embodiments utilize a mechanism by which the user device for which the simulation is to be performed provides updated information such that the profile may be updated for the simulation to be performed. Accordingly, the results of the simulation have a higher confidence to match results of what the user device may actual experience.

The exemplary embodiments provide a mechanism in which an Internet of Things (IoT) simulation performances have increased efficiency, testability, debug-ability, and accuracy by collecting data from deployed user devices and adjusting a simulation environment with real, accurate, software and hardware related simulation parameters. The exemplary embodiments thereby enable users to adapt a simulation that is to be performed for the user devices to represent a real characterization of the deployed user device. Those skilled in the art will understand that any number of reasons result in the deployed user device being different from other deployed user devices such as the manual installation of hardware and/or software components at the user's discretion. A conventional simulation does not consider hardware related parameters such as basic input output system (BIOS) version, unified extensible firmware interface (UEFI) version, firmware version, etc. Accordingly, the exemplary embodiments receive information from the deployed user devices to determine these hardware and/or software related parameters to improve upon a simulation being performed. The exemplary embodiments further receive additional information to further improve the simulation being performed such as network related parameters.

FIG. 1 shows an exemplary embodiment of a system 100 according to the exemplary embodiments. The system 100 may include a plurality of user devices 105-115 that have been deployed and are used by respective users. The system 100 may further include a provider 125 that performs simulations for the user devices 105-115 with regard to a hardware or software release to be applied thereto. The exemplary embodiments are configured to perform the simulations in a modified manner using a real characterization thereof through a profile of each of the user devices 105-115. Accordingly, the system 100 may include a communications network 120 for the information to maintain the profiles of each of the user devices 105-115 to be communicated.

Each of the user devices 105-115 may represent an electronic device utilized by a respective user for a variety of purposes. Specifically, the user devices 105-115 may be deployed devices that are being used in a real-world application and not in a testing environment, a prototype condition, etc. For example, the user devices 105-115 may be used for personal reasons, as a business device, etc. Furthermore, each of the user devices 105-115 may be any electronic component that is configured to communicate via the communications network 120. For example, one or more of the user devices 105-115 may be a portable device such as a phone, a tablet, a phablet, a laptop, a wearable, etc. In another example, one or more of the user devices 105-115 may be a client stationary device such as a desktop terminal. Accordingly, the user devices 105-115 may include corresponding components for use in the various purposes. Specifically, the user devices 105-115 may receive a release from the provider 125 that may configure a hardware or software component of the user devices 105-115. For example, the release may be a firmware update for a component included in the user devices 105-115. In another example, the release may be a new software application that is installed on the user devices 105-115. In yet another example, the release may be a physical hardware component that may be installed onto the user devices 105-115.

It should be noted that the system 100 illustrating three user devices 105-115 is only exemplary. Those skilled in the art will understand that the system 100 may include any number of user devices 105-115. It is also noted that the user devices 105-115 may each be different for any number of reasons. For example, the user devices 105-115 may be made by different manufacturers, may be installed with different types of components and/or software (e.g., operating system), may utilize different network frequencies, etc. Accordingly, the release may not necessarily apply to all of the user devices 105-115 but only to select ones.

The communications network 120 may represent any single or plurality of networks used by the user devices 105-115 to perform communication functionalities. For example, the user devices 105-115 may include a call application, a text application, an email application, a browser application, etc. that utilizes a network connection to exchange data. In another example, according to the exemplary embodiments, the user devices 105-115 may communicate with the provider 125 via the communications network 120. For example, if any of the user devices 105-115 is a personal home computer, the communications network 120 may include a home network that is initially connected thereto. The home network may connect to a network of an Internet service provider to connect to the Internet. Subsequently, through the Internet, a connection may be established with the provider 125. It should be noted that the communications network 120 and all networks that may be included therein may be any type of network. For example, the communications network 120 may be a local area network (LAN), a wide area network (WAN), a virtual LAN (ULAN), a WiFi network, a HotSpot, a cellular network (e.g., 3G, 4G, Long Term Evolution (LTE), etc.), a cloud network, a wired form of these networks, a wireless form of these networks, a combined wired/wireless form of these networks, a combination thereof, etc.

The provider 125 may be any source from which the user devices 105-115 may receive a release. The provider 125 may be an organization, a distributor, etc. that creates or receives the release to be distributed to the user devices 110-115. For example, the provider 125 may be a software developing company. In another example, the provider 125 may be an application store that receives the release from a plurality of creators for distribution. The provider 125 may include a deployment server 130 and a simulator 135. The simulator 135 will be described in further detail below.

Initially, it is noted that the provider 125 may be embodied in a variety of different ways. In a first example, the provider 125 may be associated with a common entity or organization. That is, the functionalities described herein for the provider 125 may be performed by a single entity. However, the provider 125 may also be associated with a plurality of entities or organizations. Accordingly, the provider 125 may include multiple entities where a single entity may perform one or more of the operations of the provider 125. In a second example, the provider 125 may be associated with a single entity or device that is configured to perform the functionalities described herein. However, the provider 125 may also be associated with a system in which multiple devices are used in performing the operations of the provider 125.

The distributing server 130 may be configured to transmit the release to the user devices 105-110. The release may be any update, addition, deletion, etc. to or associated with a hardware component (e.g., firmware update) or software component (e.g., an application) of the user devices 105-110. The distributing server 130 may receive the release and transmit the release to select ones of the user devices 105-110. For example, the user devices 105-110 may transmit a request for the release. Upon receiving the request, the distributing server 130 may transmit the release thereto. It should be noted that the request may also indicate information of the user devices 105-110 such that a correct release may be transmitted (e.g., the release has different versions based upon operating system). In another example, the distributing server 105-110 may receive the release and automatically transmit the release. This feature may be opted into by the users of the user devices 105-110 or may be a feature that is automatically included.

The simulator 135 may be a component utilized by or whose functionalities are provided for the provider 125 and/or the distributor 130. Specifically, the simulator 135 may be configured to perform a simulation. The simulation may be related to the release prior to distribution via the deployment server 130. Those skilled in the art will understand that a simulation of the release prior to distribution may provide information as to a potential effectiveness of the release. The simulation may also provide further information such as whether the user devices 105-115 that incorporate the release may have issues therefrom. For example, the issues may be compatibility related, bug related, etc. Thus, a successful simulation of the release for the user devices 105-115 may provide a higher success rate of incorporation of the release without errors that may be determined after the release has already been distributed.

Figure 2:
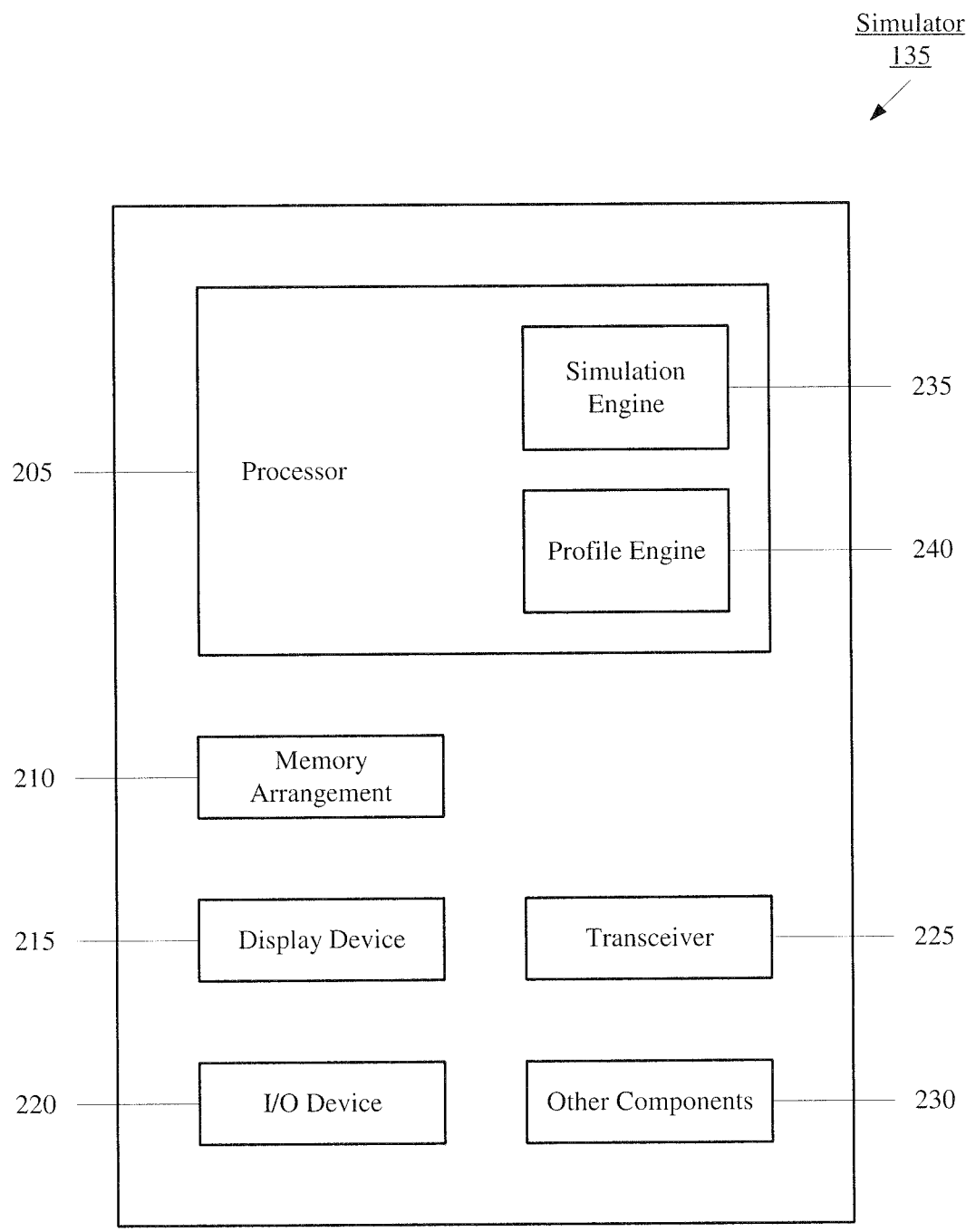
FIG. 2 shows a simulator of FIG. 1 according to the exemplary embodiments.

FIG. 2 shows the simulator 135 of FIG. 1 according to the exemplary embodiments. The simulator 135 may also be any component configured to perform simulations for user devices. The simulator 135 may represent any electronic device that is configured to perform the functionalities described herein. In a substantially similar manner as the user devices 105-115, the simulator 135 may be a portable device or a client stationary device. The simulator 135 may include a processor 205, a memory arrangement 210, a display device 215, an I/O Device 220, a transceiver 225, and other components 230 (e.g., an imager, an audio input device (for use during the voice or video communication), an audio output device (for use during the voice or video communication), a battery, a data acquisition device, ports to electrically connect the simulator 135 to other electronic devices, etc.).

The processor 205 may be configured to execute a plurality of applications of the simulator 135. For example, the applications may include a simulation engine 235. The simulation engine 235 may perform the simulation based upon the release for which the simulation pertains and a profile of the user devices 105-115. In another example, the applications may include a profile engine 240. The profile engine 240 may maintain a table of profiles corresponding to the user devices 105-115. That is, the profiles may be used by the simulation engine 235 in performing the simulations. According to the exemplary embodiments, the profiles may be updated to a real characterization of the respective one of the user devices 105-115 such that the simulation may be performed as a substantially real simulation. That is, the simulation may provide results as if the user devices 105-115 had actually incorporated the release. As will be described in further detail below, the profiles may be maintained and updated by the profile engine 235 such that the real characterization is as close if not identical to the software and hardware parameters of the user devices 105-115, respectively, as well as the conditions that the user devices 105-115 experience during its use (e.g., network parameters).

It should be noted that the above noted applications each being an application (e.g., a program) executed by the processor 205 is only exemplary. The functionality associated with the applications may also be represented as a separate incorporated component of the simulator 135 or may be a modular component coupled to the simulator 135, e.g., an integrated circuit with or without firmware.

The memory 210 may be a hardware component configured to store data related to operations performed by the simulator 135. Specifically, the memory 210 may store data related to the simulation engine 235 and the profile engine 240. For example, the results of the simulation engine 235 may be stored in the memory 210 for subsequent review. In another example, the profile table of the profile engine 240 may be stored in the memory 210. The display device 215 may be a hardware component configured to show data to a user while the I/O device 220 may be a hardware component that enables the user to enter inputs. It should be noted that the display device 215 and the I/O device 220 may be separate components or integrated together such as a touchscreen. Accordingly, the results of the simulation and the profile table may be viewed and/or manipulated via the display device 215 and/or the I/O device 220.

The transceiver 225 may be a hardware component configured to transmit and/or receive data via the communications network 120. Specifically, the transceiver 225 may enable the information from the user devices 105-115 regarding the profiles to be received. The transceiver 225 may operate on a variety of different frequencies or channels (e.g., set of consecutive frequencies) that are related to the functionalities of the different applications being performed.

According to the exemplary embodiments, the user devices 105-115 may be configured to collect and store information related to the type of hardware, the type of firmware, the types of applications, versions thereof, a behavior of the user devices 105-115, etc. The behavior of the user devices 105-115 may relate to any type of behavior or condition. For example, the behavior may relate to usage parameters in how a user utilizes or experiences the corresponding one of the user devices 105-115. The usage parameters may be a time duration in which the user device is utilized between sleep modes; a number of times that the user device is rebooted in a given time period (which may affect memory usage); etc. In another example, as noted above, the behavior may be a network parameter or a network-related parameter. The network parameter may be a number of network failovers such as a number of times per day when this occurs. During use, the information may indicate different network characteristics that are experienced by the user devices 105-115 such as a network reliability, a network disconnect issue (e.g., number of times the user devices 105-115 disconnect from the communications network 120), a number of downtime minutes, a network failover, a network bandwidth and round-trip, a number of network reboots, etc.

This information may be stored as a profile of the user devices 105-115. It should be noted that the use of the profile is only exemplary and the user devices 105-115 may store this information in any format using any collection mechanism. However, for the description herein, the profile is used as the collection mechanism. The profile may subsequently be transmitted to the profile engine 240 of the simulator 135 via the communications network 120. For example, the profiles may be transferred to an IoT cloud application as out-of-band data. The profile engine 240 may then analyze and store the profiles for subsequent use. In another example, the profiles may be transmitted upon a request from the profile engine 240 such as when a release is to be tested via simulation. In yet another example, the profiles may be transmitted constantly or upon a predetermined time limit from a prior profile update. In a further example, the profiles may be transmitted upon a change that has occurred to the profile. The continuous updating of the profile prior to running a simulation may enable the real characterization in the simulation. That is, the updating of the profile provides an adaptive simulation mechanism that remains up-to-date with the settings and characteristics of the user devices 105-115.

When the simulation engine 235 launches a simulation, the profiles of the user devices 105-115 may be used as basis to generate corresponding simulation profiles for respective simulated user devices corresponding to the user devices 105-115. Through updates of the profiles that mirror a real characterization of a usage and a settings of the user devices 105-115 as they are currently being used, the simulation for a release may be performed as if the release were actually being incorporated and used by the user devices 105-115 in the actuality. Accordingly, when the simulation is performed, the profile of the user devices 105-115 including the different types of information may be used in replicating the hardware, software, and firmware settings exactly as well as the deployment environment in the simulation. For example, using the above noted examples, if the profile indicates that the user device is rebooted three times a week, the simulation may also be rebooted three times a week. If the profile indicates that the user device experiences a network failover twice a day, the simulation may also include the network failovers.

The simulation engine 235 may include further features in performing the simulations. For example, an existing clock or a change in the clock of the user devices 105-115 may be used. When an existing clock is used, the passage of time may be simulated in real time where time moves at a common rate as experienced by the user devices 105-115 in actuality. When a change in the clock is used, the simulation may be performed in which the deployment status and behavior is experienced in a different timeline. For example, if a user device reboots three times a day and the simulating engine 235 simulates a day in five minutes, then the simulated user device reboots three times in five minutes. Each of the reboots may also be performed in the simulation to substantially correspond to when the reboots are actually performed using, for example, a median or mean time the reboots are done during the day.

Figure 3:
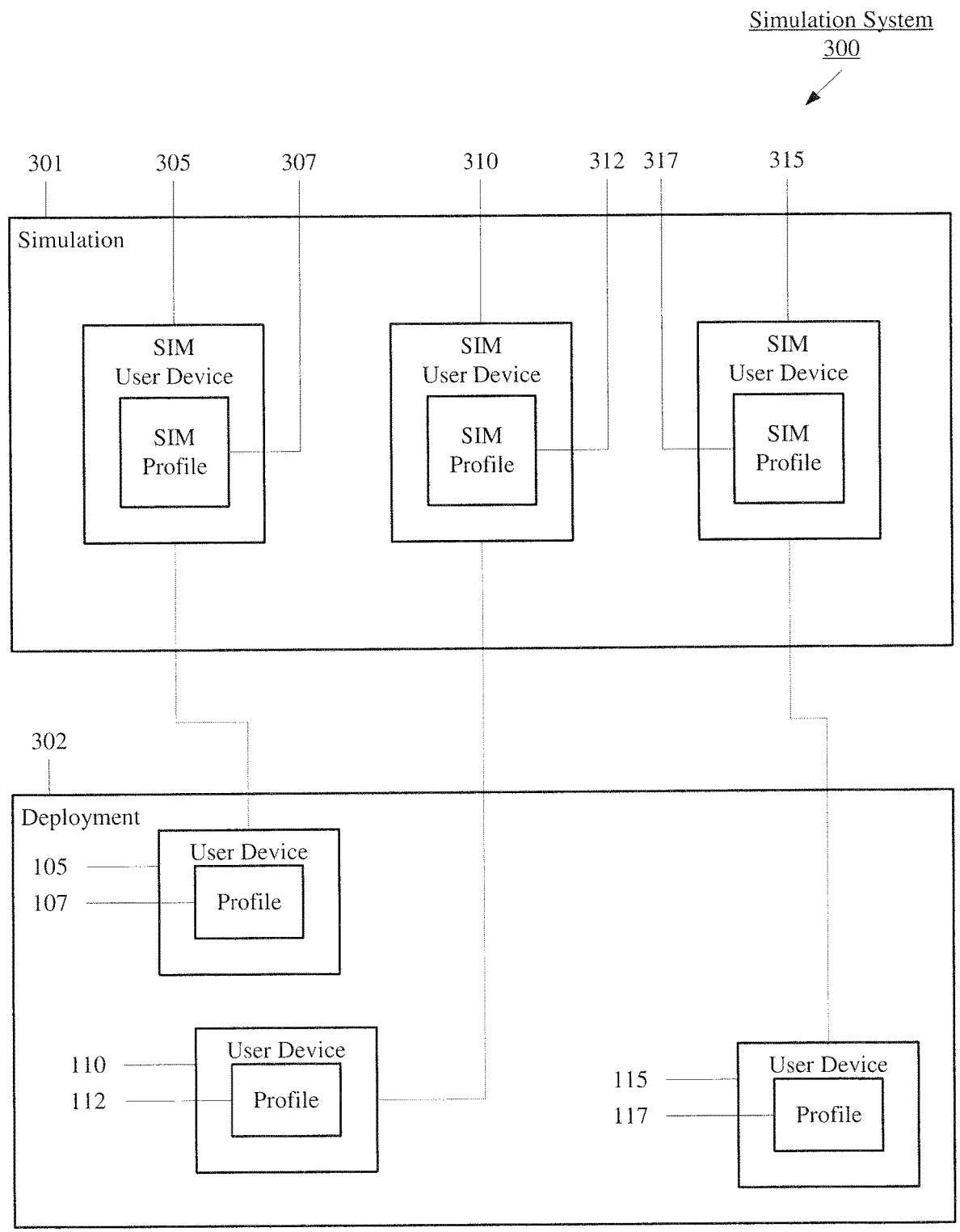
FIG. 3 shows a simulation system according to the exemplary embodiments.

FIG. 3 shows a simulation system 300 according to the exemplary embodiments. The simulation system 300 illustrates a specific example of utilizing the simulator 135 in which profiles of the user devices 105-115 are used in the simulation. As illustrated, the simulation system includes a simulation 301 and a deployment 302. The simulation 301 may an environment produced by the simulation engine 235. The deployment 302 may be an actual, real-world environment in which the user devices 105-115 are deployed and being used by respective users. Thus, with the deployment 302, the user devices 105, 110, 115 may include profiles 107, 112, 117, respectively. The simulation 301 may also include simulated user devices 305, 310, 315 with simulated profiles 307, 312, 317, respectively.

According to the exemplary embodiments, the simulator 135 may receive the information from the user devices 105, 110, 115 relating to any available settings and/or usage. The simulation may correlate the user devices 105, 110, 115 to the simulated user devices 305, 310, 315, respectively, in the simulation. The correlation of the user devices 105, 110, 115 to the simulated user devices 305, 310, 315 may also generate a correlation of the profiles 107, 112, 117 to the simulated profiles 307, 312, 317. Therefore, when the profiles 107, 112, 115, including information of settings/usage is received from any of the user devices 105, 110, 115, the simulator 135 via the profile engine 240 may maintain the profile table. In this manner, the simulated profiles 307, 312, 317 may be updated to reflect the profiles 107, 112, 117 in parallel and in real-time. That is, according to an exemplary embodiment, the update of the simulated profiles 307, 312, 317 may be performed substantially live such that a current experience on the profile may be immediately reflected in the simulated profile. Therefore, when the simulation engine 235 performs the simulation 301, the adaptive simulated incorporation of a release for the simulated user devices 305, 310, 315 may be substantially similar to an actual incorporation by the user devices 105, 110, 115. Thus, the results may provide more accurate information for the release for the user devices 105, 110, 115.

In a specific example, the profiles 107, 112, 117 may indicate various available information. For example, the profile 107 may indicate that the user device 105 has a device revision A, a firmware version 1, a BIOS revision 2.2, an average bandwidth of 320 k, an average networking disconnect of seven per day, a number of reloads of four per week, a device downtime of thirty-eight minutes, a number of network failover of twenty-five per week, and an average roundtrip time of 450 msec; the profile 112 may indicate that the user device 110 has a device revision B, a firmware version 2.1, a BIOS revision 3.0, an average bandwidth of 140 k, an average networking disconnect of five per day, and a number of reloads of nine per week; and the profile 117 may indicate that the user device 115 has a device revision B, a firmware version 2, a BIOS revision 3.0, an average bandwidth 540 k, an average networking disconnect of once per day, a number of reloads of twice per day, a device downtime of eight minutes, a number of network failover of five per week, and an average roundtrip time of 340 msec. All of this information stored by the user devices 105, 110, 115 may be transmitted to the simulator 135 such that the profile engine 240 may update the simulated profiles 307, 312, 317 so that the simulation engine 235 may perform the simulation 301 using this current set of information.

It should be noted that the simulated profiles 307, 312, 317 being used specifically for the user devices 105, 110, 115, respectively, is only exemplary. Specifically, the simulated profiles 307, 312, 317 may be used for further purposes. For example, the release may have a simulation performed therefor for new devices. Prior to new devices being deployed, a conventional knowledge of known information including hardware, software, and firmware versions and settings may be used for the simulation. However, the simulated profiles 307, 312, 317 also provide usage information including network-related parameters. Accordingly, when information is provided that is indicative of a location of where the new devices are to be deployed, the location may be correlated to the deployed user devices 105-115. In this manner, if a correlation is determined, the usage information may be transplanted for the simulation. That is, the simulation for the new devices may assume the usage properties of the corresponding deployed user device.

Figure 4:
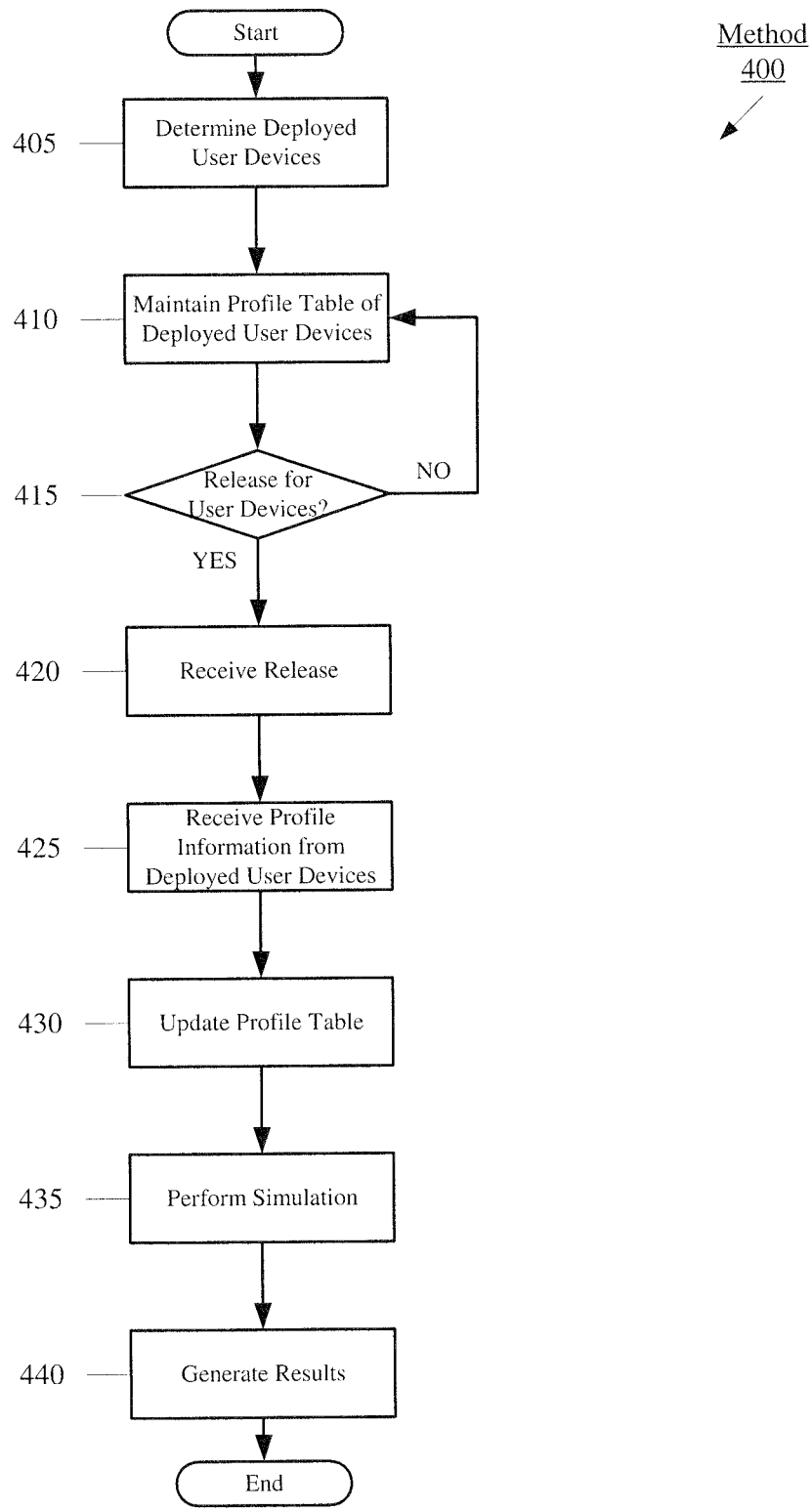
FIG. 4 shows a method for performing a simulation according to the exemplary embodiments.

FIG. 4 shows a method 400 for performing a simulation according to the exemplary embodiments. The method 400 may relate particularly to updating the profiles 107, 112, 117 of the deployed user devices 105, 110, 115 such that the simulation 301 may be performed by utilizing current simulated profiles 307, 312, 317. Accordingly, the method 400 will be described with regard to the operations performed by the simulator 135. The method 400 will be described with regard to the system 100 of FIG. 1, the simulator 135 of FIG. 2, and the simulation system 300 of FIG. 3.

In step 405, the simulator 135 may determine the deployed user devices 105, 110, 115. For example, the simulator 135 may receive information of the user devices 105, 110, 115 that are being utilized by respective users within a real-world environment. This information may be provided from a variety of sources such as from the user devices 105, 110, 115 directly, from a service provider of the user devices 105, 110, 115, from a network component in which the user devices 105, 110, 115 have established a connection, etc. From the deployed user devices 105, 110, 115, in step 410, the simulator 135 via the profile engine 240 may maintain a profile table of the deployed user devices 105, 110, 115. For example, the deployed user devices 105, 110, 115 may transmit the information that is being stored thereon in the profiles 107, 112, 117, respectively. Accordingly, the hardware, software, and firmware settings as well as usage information may be stored in the corresponding simulated profiles 307, 312, 317 stored in the profile table. It should be noted that if the profiles 107, 112, 117, the simulator 135 may utilize a previously received profile, utilize known or assumed information, rely upon a deployment settings, etc.

In step 415, the simulator 135 determines whether there is a release for the user devices 105, 110, 115. For example, the release may be an update, an addition, and/or a deletion to a hardware, a software, a firmware, etc. If no release is available, the simulator 135 returns the method 400 to step 410. However, if there is a release, the simulator 135 continues the method 400 to step 420. In step 420, the simulator 135 receives the release for which the simulation is to be performed. For example, the simulator 135 may receive the release from the deployment server 130 or directly from the source generating the release.

In step 425, the simulator 135 receives the information in the profiles 107, 112, 117 from the user devices 105, 110, 115, respectively. As discussed above, this may be one manner in which the profiles 107, 112, 117 are received from the user devices 105, 110, 115, respectively. Specifically, the simulator 135 may receive the release which indicates that a simulation is to be performed. Accordingly, the simulator 135 or other component may transmit a request for the profiles 107, 112, 117. However, as discussed above, there may be other manners of receiving the profiles 107, 112, 117. For example, the profiles 107, 112, 117 may be received continuously, at predetermined time periods, upon establishment to the communications network 120, whenever a change to the profiles 107, 112, 117 is registered, etc. In step 430, the simulator 135 updates the profile table so that the simulated profiles 307, 312, 317 reflect the information in the profiles 107, 112, 117.

In step 435, the simulator 135 may perform the simulation for the release. The simulation may be an adaptive simulation in that the simulated profiles 307, 312, 317 are constantly being updated with any available information including usage information such as network-related parameters. Thus, in step 440, the simulator 135 generates the results of the simulation where the results may be substantially similar to results as if the release had been transmitted and incorporated in the user devices 105, 110, 115 that are already deployed.

It should be noted that the method 400 described above is only exemplary. That is, the method 400 may include further steps. For example, the method 400 may include a step after step 420 where the simulator 135 determines which of the user devices 105, 110, 115 are to have the release incorporated. In a particular example, the release may be an operating system update for a first operating system. However, only the user device 105 and 110 utilize the first operating system whereas the user device 115 utilizes a second operating system. Accordingly, the profile information being received in step 425 may only be for the user devices 105, 110.

Those skilled in the art will understand that the results of the simulation may be used for a variety of purposes. For example, with a software update, the results may indicate a compatibility issue, a bug issue, an efficiency issue, etc. based upon the different permutations of settings and usage information of the user devices 105, 110, 115. Accordingly, if the simulated profile 317 of the simulated user device 315 corresponding to the user device 115 indicates that the release has a particular low efficiency due to the network-related parameters, the developer of the release may adjust the release to compensate for this issue. In this manner, the developer may transmit the release when a desired end product has been created and known from the simulations.

The exemplary embodiments provide a mechanism where a simulation is performed where a profile of a user device is used as a simulation profile of a simulated user device in the simulation. The profile may be updated and include information that is a real characterization of the user device including parameters related to usage and operations such as network parameters. Accordingly, the simulation does not rely upon an optimal or assumed set of settings/conditions. The results of the simulation may therefore utilize actual hardware, network, and computer related parameters of the deployed user devices.

The exemplary embodiments accordingly describe performing a simulation of "what-if" scenarios regarding a potential release that is to be distributed in to a real-world situation. The simulation provides a real behavior of deployment for time-sensitive applications. The simulations take into consideration a plurality of different factors such as topology, network and device reliability, specific hardware parameters, etc. The exemplary embodiments also include a mechanism for the simulation to evolve to match a real deployment where accurate tests for device upgrade, update, and interoperability may be performed. Specifically, the adaptive simulation takes into account that not all user devices are the same and over time, deployment results in different hardware, software, firmware, and operating system types. Device diversity further adds to the complexity of testing. The exemplary embodiments are capable of incorporating these aspects. The adaptive simulation additionally aligns testing conditions with current deployment behavior such as network usage behavior.

Those skilled in the art will understand that the above-described exemplary embodiments may be implemented in any suitable software or hardware configuration or combination thereof. An exemplary hardware platform for implementing the exemplary embodiments may include, for example, an Intel x86 based platform with compatible operating system, a Windows platform, a Mac platform and MAC OS, a mobile device having an operating system such as iOS, Android, etc. In a further example, the exemplary embodiments of the above described method may be embodied as a program containing lines of code stored on a non-transitory computer readable storage medium that may be executed on a processor or microprocessor.

It will be apparent to those skilled in the art that various modifications may be made in the present disclosure, without departing from the spirit or the scope of the disclosure. Thus, it is intended that the present disclosure cover modifications and variations of this disclosure provided they come within the scope of the appended claims and their equivalent.

What is claimed is:

1. A method, comprising;
   at a simulator:
   receiving a release to be incorporated into a user device, the user device being deployed in a wireless network over a previous time span;
   receiving, from the user device, a profile of the user device, the profile being indicative of settings used by the user device over the previous time span and usage information of the user device that includes at least an indication of characteristics of the wireless network experienced by the user device when deployed in the wireless network over the previous time span;
   generating a simulated user device corresponding to the user device; and
   performing a simulation incorporating the release into the simulated user device based on the settings used by the user device over the previous time span and the characteristics of the wireless network experienced by the user device when deployed in the wireless network over the previous time span, as indicated in the profile of the user device.

2. The method of claim 1, wherein the release is at least one of an update, an addition, and a deletion to at least one of a hardware, a software, and a firmware of the user device.

3. The method of claim 1, wherein the profile is sent from the user device to the simulator at one or more of (i) a time when a change in the profile is determined, (ii) after a predetermined time period, (iii) upon receiving a request from the simulator, or (iv) continuously.

4. The method of claim 1, wherein the settings and the usage information are determined and stored in the profile by the user device.

5. The method of claim 1, wherein the settings include at least one of hardware settings, software settings, or firmware settings of the user device.

6. The method of claim 5, wherein the hardware settings indicate a device revision, the firmware settings indicate at least one of a firmware version or a basic input output system (BIOS) version.

7. The method of claim 1, wherein the usage information includes an indication of actions performed by the user device over the previous time span.

8. The method of claim 1, wherein the characteristics of the wireless network include at least one of an average network reliability, a number of network disconnects, a number of network failovers, an average network bandwidth, an average roundtrip time, a number of downtime minutes, or a number of network reboots.

9. The method of claim 7, wherein the actions include a number of user device reboots, an overall usage time of the user device, or an application usage time.

10. The method of claim 1, further comprising:
generating, by the simulator, results of the simulation, the results being indicative of whether the release is to be changed prior to being provided to the user device.

11. A simulator, comprising:
a transceiver configured to exchange data with a user device; and
a processor configured to perform operations including:
receiving a release to be incorporated into a user device, the user device being deployed in a wireless network over a previous time span;
receiving, from the user device, a profile of the user device, the profile being indicative of settings used by the user device over the previous time span and usage information of the user device that includes at least an indication of characteristics of the wireless network experienced by the user device when deployed in the wireless network over the previous time span;
generating a simulated user device corresponding to the user device; and
performing a simulation incorporating the release into the simulated user device based on the settings used by the user device over the previous time span and the characteristics of the wireless network experienced by the user device when deployed in the wireless network over the previous time span, as indicated in the profile of the user device.

12. The simulator of claim 11, wherein the release is at least one of an update, an addition, and a deletion to at least one of a hardware, a software, or a firmware of the user device.

13. The simulator of claim 11, wherein the profile is sent from the user device to the simulator at one or more of (i) a time when a change in the profile is determined, (ii) after a predetermined time period, (iii) upon receiving a request from the simulator, or (iv) continuously.

14. The simulator of claim 11, wherein the settings and the usage information are determined and stored in the profile by the user device.

15. The simulator of claim 11, wherein the settings include at least one of hardware settings, software settings, or firmware settings of the user device.

16. The simulator of claim 15, wherein the hardware settings indicate a device revision, the firmware settings indicate at least one of a firmware version or a basic input output system (BIOS) version.

17. The simulator of claim 11, wherein the usage information includes an indication of actions performed by the user device over the previous time span.

18. The simulator of claim 17, wherein the characteristics of the wireless network include at least one of an average network reliability, a number of network disconnects, a number of network failovers, an average network bandwidth, an average roundtrip time, a number of downtime minutes, or a number of network reboots.

19. The simulator of claim 17, wherein the actions include at least one of a number of reboots, an overall usage time, or an application usage time.

20. A non-transitory computer readable storage medium with an executable program stored thereon, wherein the program instructs a microprocessor to perform operations comprising:
receiving a release to be incorporated into a user device, the user device being deployed in a wireless network over a previous time span;
receiving, from the user device, a profile of the user device, the profile being indicative of settings used by the user device over the previous time span and usage information of the user device that includes at least an indication of characteristics of the wireless network experienced by the user device when deployed in the wireless network over the previous time span;
generating a simulated user device corresponding to the user device; and
performing a simulation incorporating the release into the simulated user device based on the settings used by the user device over the previous time span and the characteristics of the wireless network experienced by the user device when deployed in the wireless network over the previous time span, as indicated in the profile of the user device.

* * * * *